United States Patent
Miyagi et al.

(10) Patent No.: US 8,883,030 B2
(45) Date of Patent: Nov. 11, 2014

(54) SUBSTRATE PROCESSING APPARATUS AND SUBSTRATE PROCESSING METHOD

(75) Inventors: Masahiro Miyagi, Kyoto (JP); Koji Hashimoto, Kyoto (JP); Toru Endo, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 46 days.

(21) Appl. No.: 13/596,903

(22) Filed: Aug. 28, 2012

(65) Prior Publication Data

US 2013/0078381 A1 Mar. 28, 2013

(30) Foreign Application Priority Data

Sep. 28, 2011 (JP) .................................. 2011-213272

(51) Int. Cl.
| | | |
|---|---|---|
| *B44C 1/22* | (2006.01) | |
| *B05B 1/00* | (2006.01) | |
| *B05D 1/02* | (2006.01) | |
| *H01L 21/67* | (2006.01) | |
| *B05C 13/00* | (2006.01) | |
| *B05C 11/10* | (2006.01) | |

(52) U.S. Cl.
CPC ... *B05B 1/00* (2013.01); *B05D 1/02* (2013.01); *H01L 21/67051* (2013.01); *B05C 13/00* (2013.01); *B05C 11/10* (2013.01)
USPC .................. 216/83; 216/91; 216/93; 438/745; 438/749; 134/26; 134/104.2

(58) Field of Classification Search
USPC ........... 216/83, 91, 93; 438/745, 749; 134/26, 134/104.2
See application file for complete search history.

(56) References Cited

U.S. PATENT DOCUMENTS

| | | | |
|---|---|---|---|
| 2004/0144736 A1* | 7/2004 | Yajima ......................... | 210/805 |
| 2005/0048208 A1* | 3/2005 | Kao et al. ...................... | 427/345 |
| 2010/0108096 A1* | 5/2010 | Minami et al. ................. | 134/10 |
| 2010/0261122 A1* | 10/2010 | Inatomi ......................... | 430/325 |
| 2010/0293806 A1* | 11/2010 | Liu et al. ......................... | 34/239 |
| 2011/0041871 A1* | 2/2011 | Fan .................................. | 134/1 |
| 2011/0143545 A1 | 6/2011 | Okuchi et al. | |
| 2011/0214700 A1* | 9/2011 | Hahn et al. .................... | 134/157 |
| 2012/0183909 A1 | 7/2012 | Inatomi et al. ................ | 430/435 |

FOREIGN PATENT DOCUMENTS

| | | |
|---|---|---|
| JP | 11-162808 | 6/1999 |
| JP | 2009-110985 | 5/2009 |
| JP | 2009-147038 | 7/2009 |
| TW | 201120584 A1 | 6/2011 |

* cited by examiner

Primary Examiner — Shamim Ahmed
(74) Attorney, Agent, or Firm — Ostrolenk Faber LLP

(57) ABSTRACT

A substrate processing apparatus comprising a substrate holding rotating mechanism, a process liquid supply mechanism having a nozzle for dispensing a process liquid toward a principal face of the substrate, a processing liquid reservoir for holding sufficient process liquid to form a liquid film covering the whole principal face of the substrate, a liquid film forming unit for forming the liquid film by supplying the process liquid onto the principal face of the substrate in a single burst, and a control unit for controlling the liquid film forming unit and the process liquid supply mechanism such that the process liquid is dispensed from the process liquid nozzle toward the principal face of the substrate after formation of the liquid film covering the whole area of the principal face of the substrate by the liquid film forming unit.

11 Claims, 8 Drawing Sheets

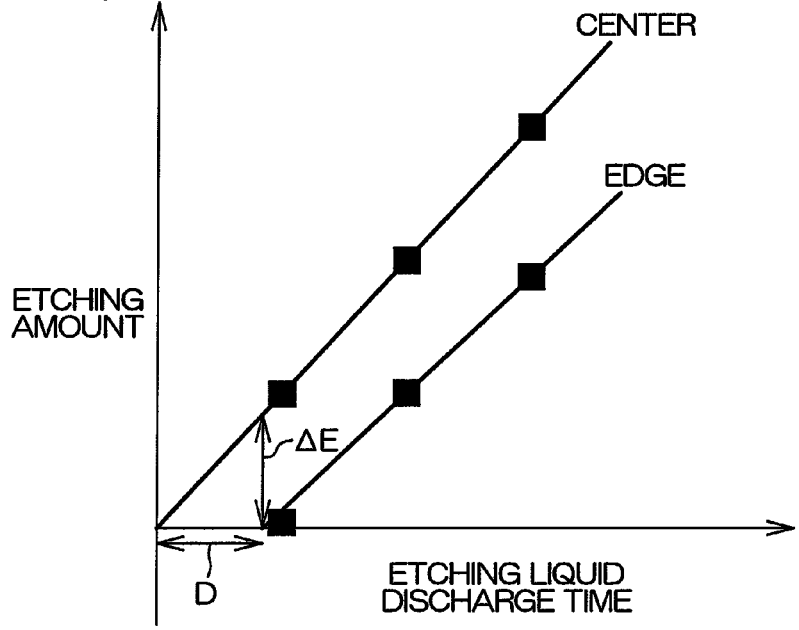
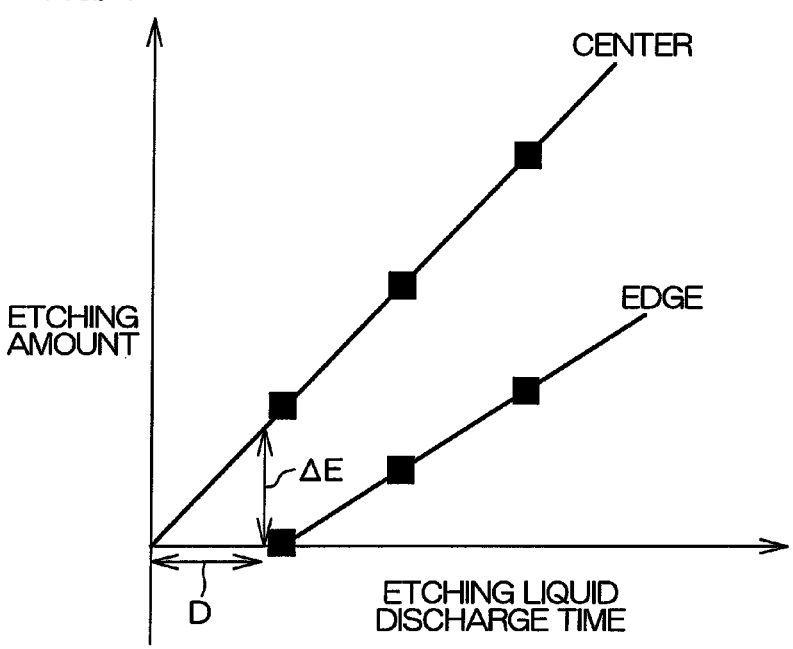

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method for processing a substrate with a process liquid. Examples of substrates to be processed include semiconductor wafers, glass substrates for liquid crystal displays, glass substrates for plasma displays, substrates for FEDs (field emission displays), substrates for optical discs, substrates for magnet-optical discs, glass substrates for photomasks, substrates for ceramics, substrates for solar cells, etc.

2. Description of Related Art

JP-A-2009-147038 discloses a substrate processing apparatus which comprises a spin chuck that holds a substrate in a horizontal position and rotate the substrate, a chemical liquid dispense nozzle for dispensing a chemical liquid onto the substrate held by the spin chuck, and a rinsing liquid dispense nozzle for dispensing a rinsing liquid onto the substrate which already have been processed by chemical liquid. The chemical liquid dispense nozzle is connected via a chemical liquid valve with a chemical liquid supply unit which is so configured as to dynamically vary flow rates of the chemical liquid.

With this configuration, the following steps are performed: a first step for supplying the chemical liquid from the chemical liquid dispense nozzle toward a surface of the substrate at a first flow rate while the substrate being rotated by the spin chuck at a first rotational speed; a second step for decreasing the substrate rotational speed into a second rotational speed that is slower than the first rotational speed while maintaining the flow rate of the chemical liquid; and a third step for decreasing a flow rate of chemical dispense liquid into a second flow rate while maintaining the substrate rotational speed at the second rotational speed. In the first step, the whole surface of the substrate is being covered with the chemical. In the second step, a heap of the chemical liquid is being formed. In the third step, newly provided chemical liquid is being supplied onto the heap.

The chemical supply unit described in JP-A-147038 has a configuration so as to be able to dynamically change flow rate of chemical liquid. But in order to do so, the chemical supply unit must be provided with a flow control valve; which is expensive and responsible for a considerable increase of overall costs.

SUMMARY OF THE INVENTION

Therefore, it is an object of the present invention to provide a substrate processing apparatus and a substrate processing method which can rapidly form a liquid film covering the whole of a principal face of a substrate, while keeping costs from increasing, thereby improving qualities of substrate processing.

A preferred embodiment of the present invention provides a substrate processing apparatus comprising: a substrate holding rotating mechanism for holding and rotating a substrate; a process liquid supply mechanism having a process liquid nozzle for dispensing a process liquid (in particular, a chemical liquid) toward a principal face of the substrate held by the substrate holding rotating mechanism; a process liquid reservoir for reserving a process liquid (preferably the same kind of process liquid as the process liquid supplied from the process liquid nozzle) in an amount sufficient to form a liquid film covering the whole area of the principal face of the substrate; a liquid film forming unit for forming a liquid film covering the whole area of the principal face of the substrate by supplying the process liquid reserved in the process liquid reservoir to the principal face of the substrate in a single burst; and a control unit for dispensing a process liquid, after forming of the liquid film covering the whole area of the principal face of the substrate, toward the principal face of the substrate that is covered with the liquid film.

With this configuration, a liquid film covering the whole of area of a principal face of a substrate can be instantly formed to deliver a process liquid throughout the whole area of the principal area of the substrate, by supplying the process liquid reserved in a process liquid reservoir in a single burst while rotating the substrate with the substrate holding rotating mechanism, thereby enabling simultaneous processing with process liquids throughout the principal surface of the substrate. Thereafter, the process liquid is substituted with a newly added process liquid throughout the principal face of the substrate by discharging (in a much smaller amount of flow volume) a new process liquid toward the principal face of the substrate via the process liquid nozzle and rotating the substrate with the substrate holding rotating mechanism. In this case, the amount of process liquids consumption can be kept low, thanks to the small amount of flow volume of the newly discharged process liquid.

The present invention enables a formation of a liquid film covering the whole area of the principal surface of the substrate, without employing expensive components such as flow control valves, by adopting a configuration wherein a process liquid reserved in a processing reservoir is supplied in a single burst to a principal face of a substrate. After the whole area of the principal face of the substrate is covered with the process liquid, only a small amount of flow volume of a process liquid is required to be supplied, thus allowing a decrease in costs by keeping the amount of process liquids consumption low, while without damaging uniformity of processing on the principal face of the substrate. Therefore, according this embodiment, it is possible to achieve a substrate processing with high uniformity on the principal face of the substrate while decreasing production and running costs.

In a preferred embodiment of the invention, the control unit controls the substrate holding rotating mechanism to rotate the substrate at a first rotational speed when forming a liquid film covering the whole area of the principal area of the substrate with the liquid film forming unit, and then at a second rotational speed that is slower than the first rotational speed when a process liquid is dispensed toward the principal face of the substrate via the process liquid nozzle after formation of liquid film covering the whole area of the principal area of the substrate.

With this configuration, when a process liquid reserved in a process liquid reservoir is supplied in a single burst toward a principal face of a substrate and reach thereon, because of the rapid rotation of the substrate at the first rotational speed, the process liquid will be instantaneously spread out by centrifugal force throughout the principal face to instantly form a liquid film covering the whole area of the principal face, thereby realizing substantially simultaneous starts of processing with process liquids throughout the principal face of the substrate. On the other hand, when a process liquid is supplied via the process liquid nozzle after the formation of the liquid film, the substrate is slowly rotated at a second rotational speed; thereby a newly supplied process liquid supplied onto the liquid film on the principal face of the substrate will be spread in an outwardly radial direction thereon. Because the rotational speed of the substrate is kept slow during the spread, replacing of process liquids occurs in a substantially uniform manner at a rotational center part and a circumferential part of the principal face of the substrate; thereby resulting in substantially equal respective processing speeds. In other words, processing by process liquids can be started at substantially the same time throughout the principal face of the substrate, and respective processing speeds can be almost equalized. As a result of this, further improvements on uniformity of substrate processing can be achieved.

In a preferred embodiment of the invention, the process liquid supply mechanism in the substrate processing apparatus may include a process liquid supply source for connecting a process liquid supply source and the process liquid nozzle. In this case, the process liquid reservoir is preferably connected with the process liquid supply path.

With this configuration, a process liquid can be guided into the process liquid reservoir via the process liquid supply path. Also, the process liquid reserved in the reservoir can be supplied onto a principal face of a substrate via the process liquid supply path.

In a preferred embodiment of the invention, the liquid film forming unit may include a pressurized gas supply mechanism that pushes out a process liquid reserved in the process liquid reservoir by pressurized air. With this relatively inexpensive configuration utilizing pressurized gas, process liquid reserved in the reservoir can be discharged in a single burst onto a principal face of substrate.

The pressurized gas supply mechanism preferably includes a gas pipe connected with the process liquid reservoir and a pressurized gas valve interposed on the gas pipe. In this case, it is preferable that the process liquid supply unit further includes a process liquid valve interposed on the process liquid line; and the process liquid reservoir is connected with the process liquid supply line at a place between the process liquid supply source and the process liquid valve; and the process liquid supply unit further includes a relief pipe connected with the gas pipe and a relief valve interposed on the relief valve.

With this configuration, a process liquid can be reserved in the process liquid reservoir by activating a pump in a state wherein the process liquid valve, the pressurized gas valve, and the relief valve are closed, to guide a process liquid from the process liquid source into the process liquid reservoir. In turn, when the process liquid valve is opened, the relief valve is closed, and the pressurized gas valve is opened, the process liquid reserved in the process liquid reservoir is pushed out into the process liquid supply path because of the pressure applied to the process liquid supply path to be discharged in a single burst toward the principal face of the substrate via the process liquid nozzle.

It should be apparent that supplying of a process liquid into the process liquid reservoir does not necessarily have to be conducted via the process liquid supply line and may be conducted via other route separately provided. And the discharge of process liquid from the process liquid reservoir toward the principal face of the substrate does not necessarily have to be conducted via the process liquid supply line and may also be conducted via a discharge route that is separately arranged.

In a preferred embodiment of the invention, the process liquid reservoir includes a first process liquid reservoir for reserving a first type of process liquid and a second process liquid reservoir for reserving a second type of process liquid; and the liquid film forming unit is configured such that the first type of process liquid and the second type of process liquid are discharged in a single burst respectively from the first and the second process liquid reservoirs and are supplied, as they are mixed together, onto a principal face of the substrate.

With this configuration, the whole area of the principal face of the substrate can be instantaneously covered with a prepared process liquid by reserving the first and the second type of process liquids respectively in the first and the second process liquid reservoirs, mixing them (for example, mixing them within pipes) and supplying them, shortly after the mixing, onto the principal face of the substrate.

Concerning the above configuration, it might be conceivable to have an alternative configuration in which a first and second flow control valves are individually disposed at on a first and second process liquid lines so as to, when processing starts, supply the first and second process liquid each in large volumes into a mixing point thereof, for example. But such configuration has problems not only in that flow control valves are expensive but also in that mix ratios for the first and the second process liquid tend to become unstable when flow rates vary. That is, it is difficult to maintain mix ratios for process liquids when flow rates for the process liquids vary. The aforementioned configuration according to a preferred embodiment of the invention provides a solution to those problems.

In a preferred embodiment of the invention, a liquid film forming unit includes a transfer mechanism for transferring the process liquid reservoir between a process liquid discharge position above a principal face of a substrate held with a substrate holding rotating mechanism and a retreat position away from the process liquid discharge position; and a process liquid discharge mechanism for discharging a process liquid reserved in the process liquid reservoir at the process liquid discharge position.

With this configuration, the process liquid reservoir can be transferred to the process liquid discharge position above the principal face of the substrate when necessary so that it can discharge the process liquid therefrom. Thus, taking advantage of gravity force, the process liquid can be discharged in a single burst. Adding to this, the process liquid reservoir can be retreated from near the principal face of the substrate so as to avoid mechanical interferences, either when a substrate to be processed is transferred into or a processed substrate is transferred out of the substrate holding rotating mechanism. The process liquid reservoir can also be retreated into a retreat position so as to avoid occurrence of dripping of process liquids etc. from the reservoir onto the principal face of the substrate.

It is preferable that the process liquid to be discharged from the process liquid nozzle is supplied into the process liquid reservoir when the process liquid reservoir is positioned at the retreat position.

With this configuration, the process liquid can be supplied using the process liquid nozzle when the process liquid reservoir is positioned at the retreat position. Thus, since it is unnecessary to provide a dedicated component for supplying process liquid supply into process liquid reservoir, it is possible to reduce costs.

For example, when a nozzle transfer mechanism for transferring a process liquid nozzle between a process position opposing the principal face of the substrate and a nozzle retreat position retreated from the process position, the nozzle retreat position is preferably positioned at a position from which the process liquid nozzle is able to discharge a process liquid toward a process liquid inlet for the process liquid reservoir positioned at the retreat position. More specifically, the nozzle retreat position may be just above the retreat position for the process liquid reservoir. With such a configuration, a process liquid can be supplied into a process liquid reservoir utilizing a period when the process liquid nozzle is not occupied for supplying of process liquids onto the principal face of the substrate.

In a preferred embodiment of the invention, a substrate process apparatus further includes a process liquid recovering mechanism which recovers a process liquid supplied from the process liquid nozzle, supplied onto the substrate, and then processed on the substrate held with the substrate holding rotating mechanism; and guides the process liquid into the process liquid reservoir.

With this configuration, used process liquids can be recovered, reserved in the process liquid reservoir, and recycled to form a liquid film covering the whole area of the principal face of the substrate; therefore contributing to a further decrease in an consumption amount of process liquids and a consequential decrease in running costs.

It is another object of the invention to provide a substrate process method which comprises a substrate rotating step for rotating a substrate; a reserving step for reserving a process liquid sufficient to form a liquid film covering the whole area of the principal face of the substrate; liquid film forming step for forming the liquid film covering the whole area of the principal area of the substrate; and a dispensing step after the liquid film forming step for dispensing a process liquid from a process liquid nozzle onto the principal face of the substrate being rotated.

In a preferred embodiment of the invention, the substrate rotating step includes a step for rotating the substrate at a first rotational speed in parallel with the liquid film forming step; and a step for rotating the substrate at a second rotational speed slower than the first rotational speed in parallel with the dispense step for dispensing a process liquid from the process liquid nozzle after the liquid film forming step.

The liquid film forming step may include a pressurized gas supplying step for pushing out a process liquid reserved in the process liquid reservoir by pressurized gas.

The process liquid reservoir may include a first process liquid reservoir for reserving a first type of process liquid and a second process liquid reservoir for reserving a second type of process liquid. In this case, the liquid film forming step may include a step wherein the first type of process liquid is discharged in a single burst from the first process liquid reservoir, the second type of process liquid is discharged in a single burst from the second process liquid reservoir, and both of the liquids are supplied, as they are being mixed together, toward the principal face of the substrate.

The liquid film forming step may include a process liquid discharging step for discharging a process liquid reserved in the process liquid reservoir at a process liquid discharging position above the principal face of the substrate being rotated.

The reserving step for reserving step for reserving a process liquid in the process liquid reservoir may include a step wherein the process liquid reservoir is disposed at the retreat position retreated from the position above the principal face of the substrate; and a process liquid is dispensed from the process liquid nozzle into the process liquid reservoir.

The substrate processing method according to the present invention may further include a process liquid recovery step for recovering the process liquid which is supplied onto the substrate from the process liquid nozzle and used for processing and for guiding the process liquid into the process liquid reservoir.

The aforementioned and other objects, features, and effects of the present invention shall be clarified by the following description of a preferred embodiment with references to the accompanying drawings.

BRIEF DESCRIPTION OF THE DRAWINGS

FIG. 3 is a schematic graph illustrating etching differences between at a rotational center and an edge portion of a substrate, wherein etching liquid is used as chemical liquid, and substrate rotational speed is relatively slow.

FIG. 4 is a schematic graph illustrating etching differences between at a rotational center and an edge portion of substrate, wherein etching liquid is used as chemical liquid, and substrate rotational speed is relatively fast.

DETAILED DESCRIPTION OF THE EMBODIMENTS

Figure 1:
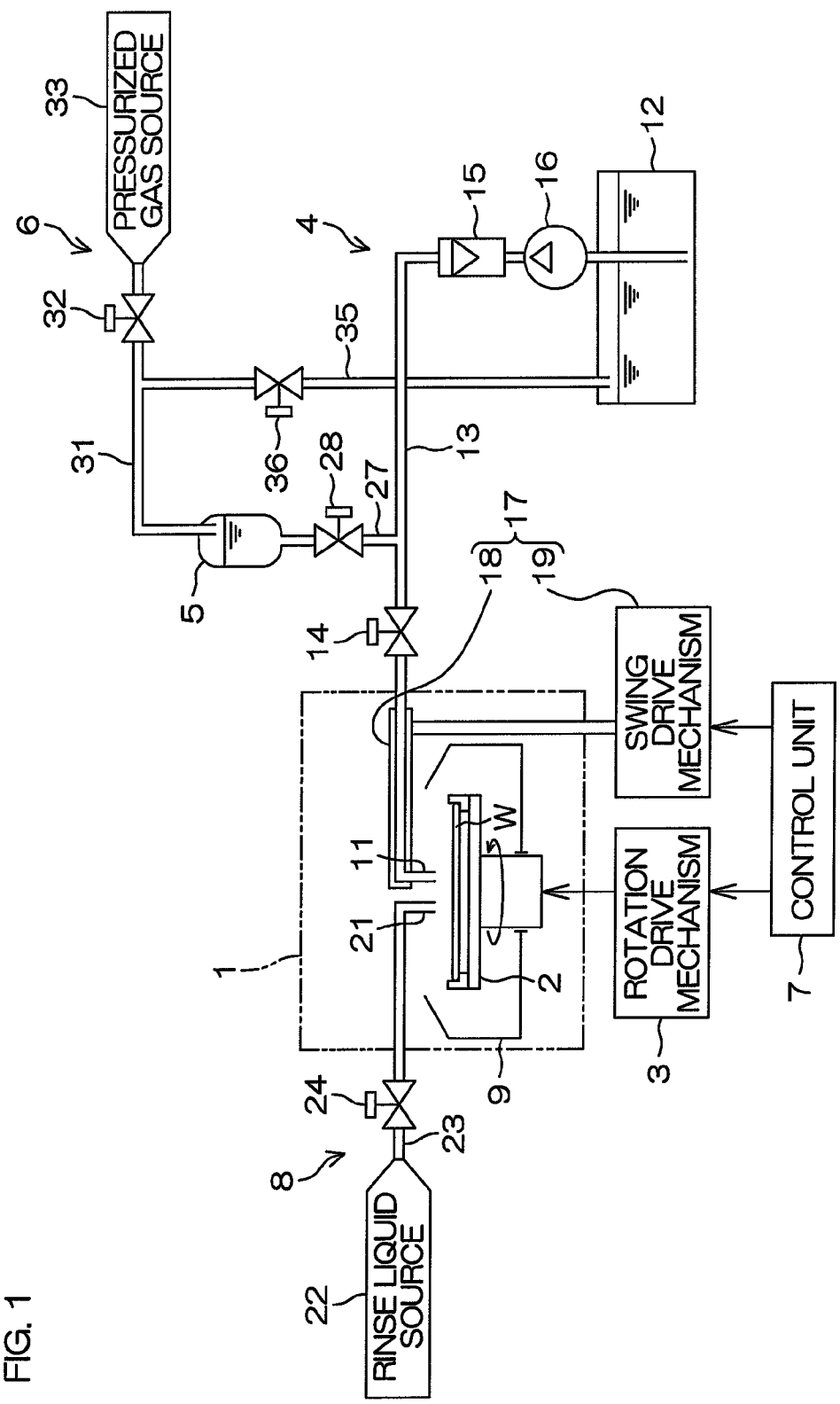
FIG. 1 illustrates a configuration of a substrate processing apparatus in accordance with a first embodiment of the present invention.

FIG. 1 illustrates a configuration of a substrate processing apparatus concerning the first preferred embodiment of the invention. The substrate processing apparatus is single wafer type substrate processing apparatus for processing a wafer W such as semiconductor wafers with process liquids, one wafer at a time. This substrate process apparatus comprises a process chamber 1; a spin chuck 2 which is arranged within the process chamber 1 and is able to horizontally hold and rotate a wafer W around a vertical axis; a rotation drive mechanism 3 which rotates the spin chuck 2 around the vertical axis; a process liquid supply unit 4 which supplies a chemical liquid to the substrate W held with the spin chuck 2; and a rinse liquid supply unit 8 which supplies a rinse liquid (for example, deionized water) toward the substrate W held with the spin chuck 2.

The substrate processing apparatus further includes a chemical liquid buffer tank 5 for temporarily reserving a chemical liquid that is a same type of chemical liquid supplied by the chemical liquid supply unit 4; and a pressurized gas supply unit 6 for supplying a pressurized gas into the chemical liquid buffer tank 5 to push out the chemical liquid reserved in the chemical liquid buffer tank 5 in a single burst. The spin chuck 2 is accommodated inside of a process cup 9. The process cup 9 is formed in a tubular shape with an upper opening and a bottom and is configured so as to receive processing liquids which are being laterally flied out as a result of centrifugal force applied thereto. The substrate processing apparatus further includes a rotating drive mechanism 3, a chemical liquid supply unit 4, and a control unit 7 for controlling the pressurized gas supply unit 6 or the like.

The spin chuck 2 holds the substrate W in a horizontal posture, with the principal face of the substrate to be treated facing upward. The rotation drive mechanism 3 rotates the substrate W around the vertical axis by rotating the spin chuck 2. In this manner, a substrate holding rotating mechanism is configured with the spin chuck 2 and the rotation drive mechanism 3. Rotational speed of the spin chuck 2, or namely the rotational speed of the substrate W, is variably controlled by control unit 7 that controls rotation drive mechanism 3.

The chemical liquid supply unit 4 includes a chemical liquid nozzle 11 disposed inside of the process chamber 1; and a chemical liquid pipe 13 (an example for process liquid supply line), an end of which is connected to the chemical liquid nozzle 11 and another end of which extends to outside of the process chamber 1 to be connected to the chemical liquid tank 12. The chemical liquid tank stores a chemical liquid which is prepared beforehand to a predetermined density. The chemical liquid may be of etching liquid (for example, hydrofluoric acid). The chemical liquid supply unit 4 further includes a chemical liquid valve 14 (an example of process liquid valve) interposed at a position along the chemical liquid pipe 13; a flowmeter 15 interposed at a position along the chemical liquid pipe 13 at a more upstream side than the chemical liquid valve 14; and a pump 16 interposed at a position along the chemical liquid pipe 13 at a more upstream side than the flowmeter 15. The pump 16 and the chemical tank 12 constitute a chemical liquid supply source for pushing out chemical liquids into the chemical liquid pipe 13. Output signals of flowmeter 15 are configured to be inputted into the control unit 7. The control unit 7 controls open/close of the chemical liquid valve 14 and operations of the pump 16. When the pump 16 is activated with the chemical liquid valve 14 opened, a chemical liquid reserved in the chemical liquid tank 12 is pumped out, flows through the chemical liquid pipe 13, and is supplied into the chemical liquid nozzle 11. The pump 16 is driven so that chemical liquid is dispensed from the chemical liquid nozzle 11 at a predetermined flow rate. The flow rate is under surveillance based on outputs from the flowmeter 15 in that whether it is in a tolerance range or not.

The chemical liquid nozzle 11 is arranged so that it can be transferred inside the process chamber by a nozzle transfer mechanism 17. The nozzle transfer mechanism 17 includes swing arm 18 arranged inside the process chamber 1 and a swing drive mechanism 19 that swings the swing arm 18 around the vertical axis. The chemical liquid nozzle 11 is fixed on the distal portion of the swing arm 18. The swing arm 18 extends horizontally and is swung around the vertical axis set along the spin chuck 2 by the swing drive mechanism 19; thereby the distal portion of the swing arm 18 is transferred along an arcuate trajectory in a horizontal plane. This allows the chemical liquid nozzle 11 to be transferred between a process position (above the spin chuck 2) opposing the upper face of the substrate W held by the spin chuck 2 and a retreat position retreated from above the spin chuck 2. The process position allows the chemical liquid nozzle to dispense chemical liquid toward the rotational center of the substrate, for example.

A rinse liquid supply unit 8 includes a rinse liquid nozzle 21 arranged inside the process chamber 1 and a rinse liquid pipe 23 one end of which is connected with the rinse liquid nozzle 21 and another end of which extends to outside of the process chamber 1 to be connected to the rinse liquid source 22. The rinse liquid supply unit 8 further includes a rinse liquid valve 24 interposed at a position along the pipe 23. A control unit 7 controls open/close of the rinse valve 24. When the rinse valve 24 is opened, a rinse liquid from the rinse liquid source 22 flows through the rinse liquid pipe 23 and is supplied into the rinse liquid nozzle 21; thereby allowing the rinse liquid nozzle 21 to dispense the rinse liquid to be supplied toward the principal face (upper face) of a substrate W.

The rinse liquid nozzle 21 may be mounted, along with the chemical liquid nozzle 11, on the swing arm 18 of the nozzle transfer mechanism 17. Also, the rinse liquid nozzle 21 may be transferrable, by a nozzle transfer mechanism alternative to the nozzle transfer mechanism, between a process position above the spin chuck 2 and a retreat position for retreating from above the spin chuck 2 to sideway. Further, rinse liquid nozzle 21 may take the form of nozzle fixture fixed inside the process chamber 1.

A chemical liquid buffer tank 5 is a chemical liquid reservoir having a volumetric capacity to reserve a sufficient quantity of chemical liquids to form a liquid film covering over the whole area of the principal face (upper face) of the substrate W held by the spin chuck 2. The chemical liquid buffer tank 5 is a hermetically closed reservoir; to the lower face of which a chemical liquid discharge path 27 is connected, and to the upper face of which gas pipe 31 is introduced. More specifically, the chemical liquid discharge path 27 is connected with a chemical liquid pipe 13 at between a pump 16 and a chemical liquid valve 14. Interposed at along the chemical liquid discharge path 27 is a chemical liquid discharge valve 28; open/close of which is controlled by the control unit 7.

The pressurized gas supply unit 6 is configured so as to push out a chemical liquid reserved in the chemical liquid buffer tank 5 by pressurized gas. More specifically, the pressurized gas supply unit 6 has a gas pipe 31 connected with the chemical liquid buffer tank 5 and a pressurized gas valve 32 interposed at a position along the gas pipe 31. The gas pipe is configured so that pressurized gas from the pressurized gas supply source 33 is supplied into the gas pipe. Preferably, the pressurized gas is of inert gases such as nitrogen gas or the like. Open/close of the pressurized gas valve 32 is controlled by the control unit 7.

One end of a relief pipe 35 is connected to the gas pipe 31 at a position between the chemical liquid buffer tank 5 and the pressurized gas valve 32, while the another end of which is introduced into the chemical liquid tank 12. At a position along the relief valve 35, a relief valve 36 is interposed. Open/close of the relief valve 36 is controlled by the control unit 7.

Figure 2:
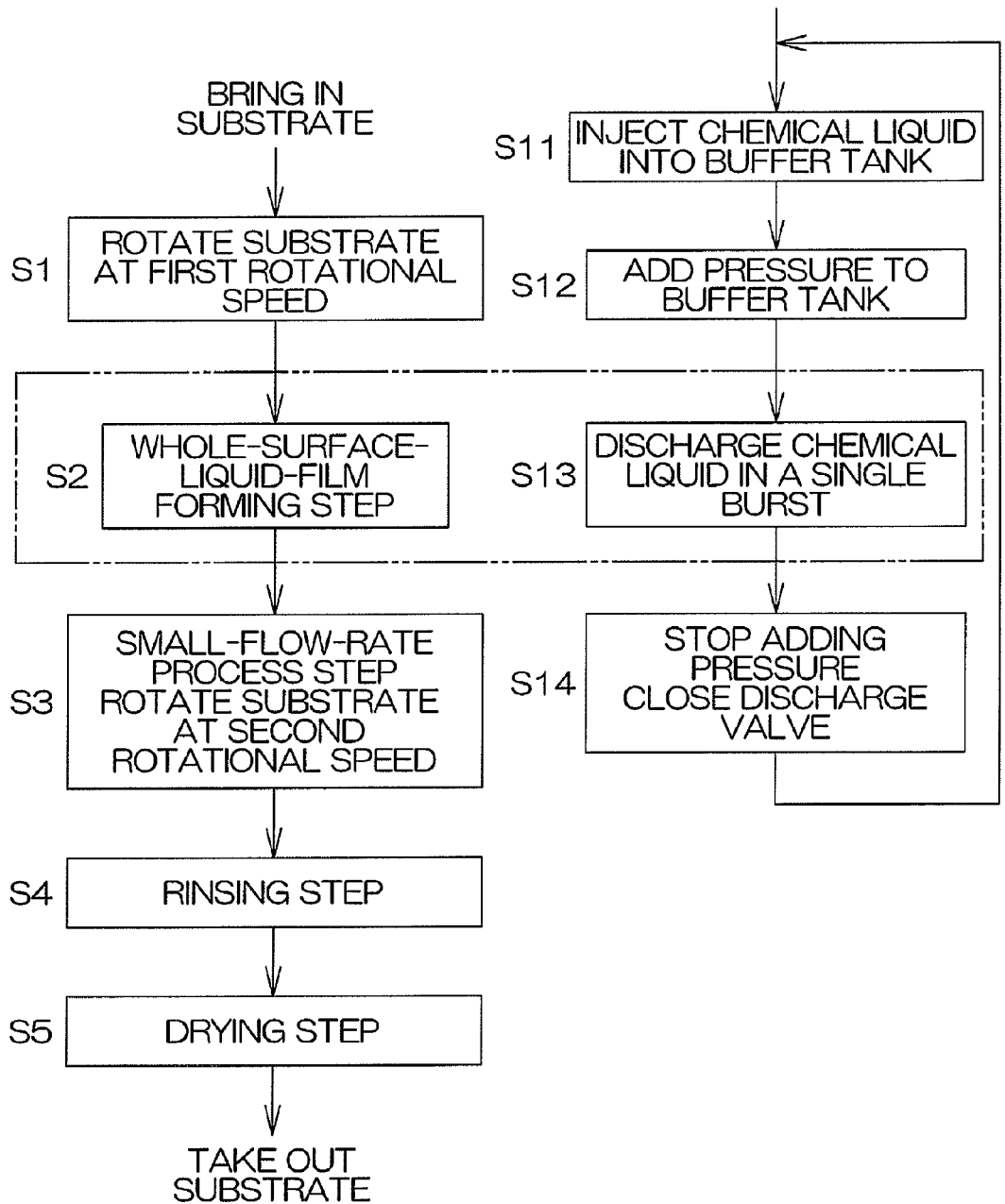
FIG. 2 is a flowchart showing steps of the substrate processing apparatus.

FIG. 2 is a flowchart illustrating operations of the substrate process apparatus.

When an unprocessed substrate W is introduced into a process chamber 1 and handed over onto a spin chuck 2 by a substrate transfer robot, a control unit 7 rotates the substrate W at a first rotational speed (for example, about 1,000 rpm) (step S1). That is, the control unit 7 rotates the spin chuck 2 at the first rotational speed by controlling the rotation drive mechanism 3. Thereafter, a chemical processing starts.

Before the commencement of chemical processing, the control unit 7 executes a chemical liquid injection procedure for injecting a chemical liquid into the chemical liquid buffer tank 5 (step S11). Specifically, the control unit 7 activates a pump 16 in a state wherein both a chemical liquid valve 14 and a pressurized gas valve 32 are closed and both a chemical liquid discharge valve 28 and a relief valve 36 are opened. Then as a result of this, the chemical liquid pumped out from the pump 16 flows into the chemical liquid buffer tank 5 via from the chemical liquid pipe 13 to chemical liquid discharge path 27. Gas in the chemical liquid buffer tank 5 is pushed into the chemical liquid tank 12 via from the gas pipe 31 to relief pipe 35. By activating the pump 15 for a period corresponding to the amount of chemical liquid to be reserved in the chemical liquid buffer tank 5, requisite quantity of chemical liquid can be reserved in the chemical liquid buffer tank 5. Thereafter, the control unit 7 closes the relief valve 36 while maintaining the activation of the pump 16. Furthermore, the control unit 7 opens the pressurized gas valve 32 and supplies a pressurized gas into the chemical liquid buffer tank 5 to add pressure therewithin (step S12).

The chemical processing includes a whole-surface-liquid-film forming step (step S2) and a small-flow-rate process step (step S3).

In the whole-surface-liquid-film forming step (step S2), the whole of the chemical liquid reserved in the chemical liquid buffer tank 5 is supplied onto the principal face (upper face) of the substrate W in a single burst. More specifically, the opening of chemical liquid valve 14 by the control unit 7 causes the whole quantity of the chemical liquid reserved in the chemical liquid buffer tank 5 to be pushed out into the chemical liquid pipe 13 by pressurized gas, to be discharged in a single burst in large quantity from the chemical liquid nozzle 11 toward the upper face of a substrate W (step S13). Before the discharge, the control unit 7 transfers the chemical liquid nozzle 11 to a processing position above of the spin chuck 2. Since the chemical liquid is dispensed in large quantity from the chemical liquid nozzle 11 and the substrate W is rotated at a first rotational speed, the chemical liquid instantaneously spreads out throughout the whole area of the principal face of the substrate W to form a liquid film covering the whole area of the principal face of the substrate W. To be more specific, dispensing of chemical liquid reserved in the chemical liquid buffer tank 5 for an amount of 30 to 70 cc is completed within about 2 seconds for example; thereby instantaneously covering the whole area of the principal face of the substrate W with a liquid film.

Thereafter the control unit 7 closes the pressurized gas valve 32 to stop adding pressure, and closes the chemical liquid discharge valve 28 (step S14). With this, a chemical liquid pumped out from the chemical liquid tank 12 by the pump 16 is supplied via from the chemical liquid pipe 13 to the chemical liquid nozzle 11, and is dispensed from the chemical nozzle 11 at a small-flow-rate to be supplied onto the principal face of the substrate W. In this manner, the small-flow-rate process (step S3) is performed. In step S3, the control unit 7 decreases the rotational speed of the spin chuck 2 (thus that of the substrate W) to a second rotational speed (for example, about 100 rpm) that is slower than the first rotational speed, by controlling a rotation drive mechanism 3. So, in the small-flow-rate process step (step S3), a chemical liquid is supplied to the liquid film on the surface of the substrate W rotated at a slow speed. The flow rate for the chemical liquid from the chemical liquid nozzle 11 in the step S3 may be about 0.25 liter/minute, for example. Such a small-flow-rate process continued for about 30 seconds.

Thereafter the control unit 7 closes a chemical liquid valve 14, deactivates the pump 16 to terminate the chemical processing, and then executes a rinsing step (step S4). Specifically, the control unit 7 opens the rinsing liquid valve 24 to allow the rinsing liquid nozzle 21 to dispense a rinsing liquid toward the principal face of the substrate W. Furthermore, the control unit 7 controls the rotation drive mechanism 3 to control a rotational speed of the spin chuck 2 (consequently, that of the substrate W as well) at a predetermined rinse process speed (for example, 1,000 rpm). With this, the rinsing liquid supplied to the principal face of the substrate W spreads over the whole area of the substrate to be substituted with the chemical liquid. The supplying of the rinsing liquid continues for about 30 seconds, for example.

Thereafter the control unit 7 stops dispensing of the rinsing liquid by closing the rinsing liquid nozzle 21 and the rinsing process (step S4) ends. Then, the control unit 7 executes a drying step (step S5) by controlling the rotation drive mechanism 3 to control a rotational speed of the spin chuck 2 (that of the substrate W as well) at a predetermined drying process speed (for example, about 3,000 rpm). With this, residue of water on the principal face of the substrate W is thrown off with centrifugal forces applied thereon. This spin dry processing continues about 10 seconds, for example.

Followed by completion of the drying step in the manner described above, the processed substrate W is transferred to the outside of the process chamber 1 by a substrate transfer robot. Thereafter, each time an unprocessed substrate W is transferred into the process chamber 1, similar procedures will be repeated.

FIG. 3 is a schematic graph illustrating differences between a case of a rotational center portion and a case of a peripheral (edge) portion of a substrate. Horizontal axis indicates starting time of etching liquid dispensing, and longitudinal axis indicates amount of etching.

In a case that a etching liquid is dispensed at the center of a substrate, it takes some time before the etching liquid reaches to the peripheral portion of the substrate with centrifugal forces applied thereto. Thus, there will be a time delay D for a starting time of the etching at peripheral portion of the substrate, compared to that at the rotational center of the substrate. As time lapses for an amount of the delay D, etching at the rotational center of the substrate advances to yield an amount of $\Delta E$ of etching. Such etching difference inevitably occurs no matter how long the overall etching-liquid-dispense-time might be.

Thus, the aforementioned embodiment is configured such that, upon starting of a chemical liquid processing, a chemical liquid reserved in the chemical liquid buffer tank 5 is dispensed in a single burst onto the principal face of the substrate W, instantaneously covering the whole area thereof with a liquid film of the chemical liquid. Thereby the delay D can be decreased to substantial zero with this configuration; therefore it is possible to eliminate the etching amount difference resulted from the time difference between the rotational center and the peripheral portion of the substrate W.

Furthermore, the inventors of the present invention have found out that when flow rate of the etching liquid is suppressed (for example, 0.25 liter/minute) to decrease amount of consumption thereof, there exists a relationship between uniformities of etching over a face of a substrate and rotational speeds for the substrate. To be more specific, when rotational speed of substrate is high (for example, at 1,000 rpm), lines in FIG. 4 representing etching amount at the center and at a peripheral portion of the substrate are not in parallel to each other. This means that etching rate is higher at the rotational center than at a peripheral portion of the substrate; consequently, longer dispensing time of etching liquid yields greater difference of respective etching amounts.

Thus, according to aforementioned embodiment, in the small-flow-rate processing step, a rotational speed of the substrate is set to a second rotational speed that is slow. With this setting, chemical liquid processing at the rotational center and at a peripheral portion of the substrate proceeds almost concurrently. As a result of this, uniform processing by chemical liquids over the whole area of the principal face of the substrate W can be realized.

As described above, according to this embodiment, a liquid film covering the whole of area of a principal face of a substrate W can be formed without using expensive parts such as flow control valves by employing a configuration such that a chemical liquid reserved in the chemical liquid buffer tank 5 is supplied onto the substrate in a single burst. After that, since only a small-flow-rate of chemical liquid is required for supplying from the chemical nozzle 11, running costs can be decreased by suppressing amounts of consumption for chemical liquids without damaging process uniformity within the principal face of the substrate W. In this manner, a substrate processing with high uniformity within a substrate face can be realized while decreasing both manufacturing and running costs.

Furthermore, according to this embodiment, when a chemical liquid reserved in the chemical liquid buffer tank 5 is supplied onto the principal face of the substrate W in a single burst, a liquid film covering over the whole area of the principal face of the substrate W can be instantaneously formed due to a rapid rotation of the substrate W at a first rotational speed. Thereby, chemical processing all over the principal face of the substrate W can be started substantially simultaneously. On the other hand, when a chemical liquid is dispensed from the chemical liquid nozzle 11 after formation of a chemical film, rotational speed of the substrate is set to a second rotational speed which is slower. The rotation spreads a new chemical liquid, supplied onto the liquid film on the principal face of the substrate W, in an outwardly radial direction. By maintaining the slow rotational speed while the new added chemical spreads, chemical liquids replacements at in the vicinity of the rotational center and peripheral portion advance nearly equally, thus resulting in nearly equal processing rates. In other words, it is possible to start processing with chemical liquid throughout the principal face of the substrate W at a substantially simultaneous time, and it is also possible to achieve nearly homogeneous processing rates, thereby improving substrate processing over the face of the substrate.

Figure 5:
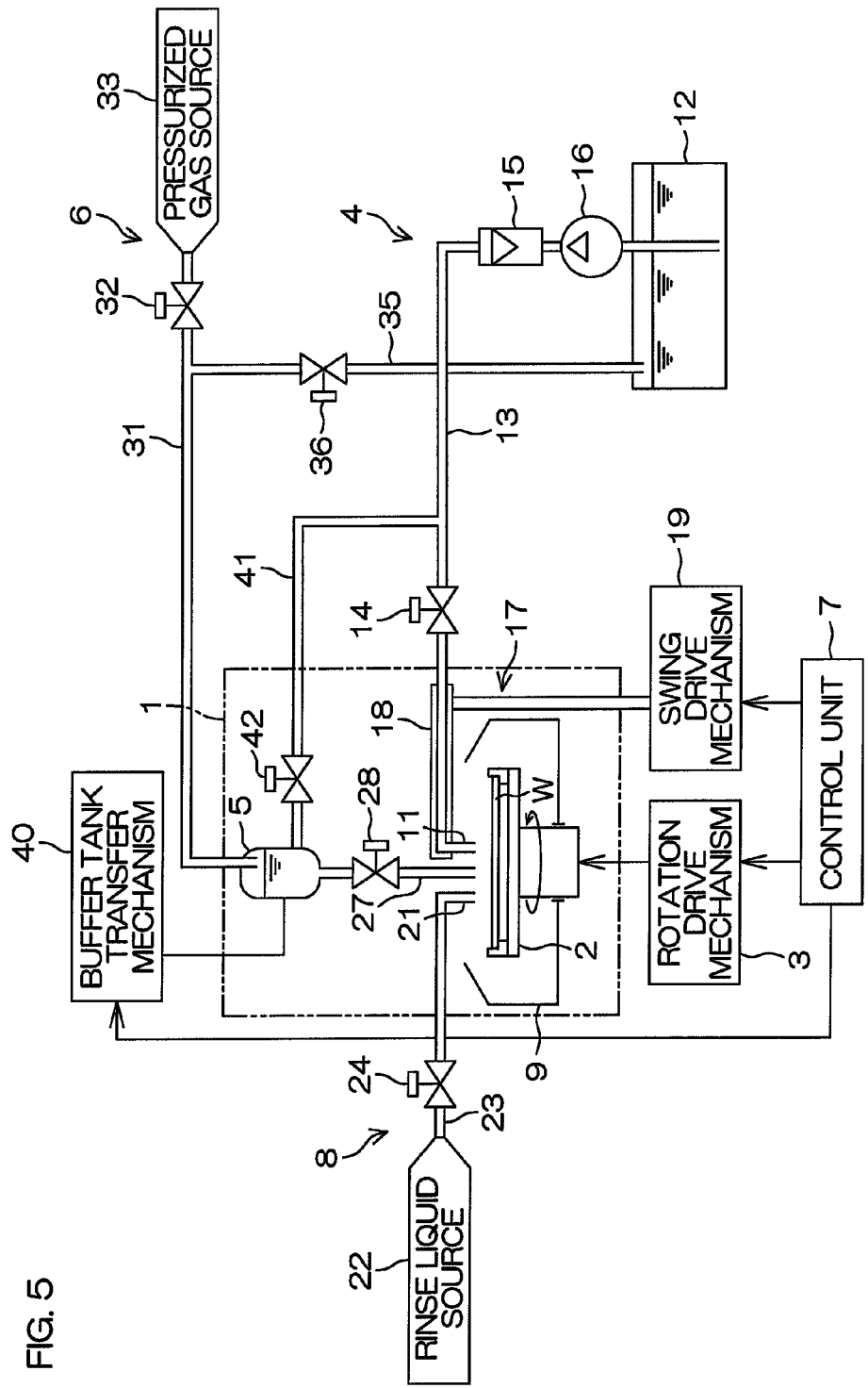
FIG. 5 illustrates a configuration of a substrate processing apparatus in accordance with a second embodiment of the present invention.

FIG. 5 illustrates a configuration of a substrate processing apparatus according to the second embodiment of the invention. In FIG. 5, parts already shown in aforementioned FIG. 1, are shown corresponding reference numerals.

In this embodiment, a chemical liquid buffer tank 5 is provided inside of a process chamber 1. And a buffer tank transfer mechanism 40 is provided for transferring the chemical liquid buffer tank 5 between a discharge position which is above a spin chuck 2 and a retreat position which is at a sideway from above the spin chuck 2. The buffer mechanism 40 may include a horizontal swing arm supporting the chemical liquid buffer tank 5 at a distal portion thereof, a swing drive mechanism for swinging the swing arm around a vertical axis provided outside of a processing cup 9, and an up/down drive mechanism for moving upwardly/downwardly the swing arm, for example. In this case, the retreat position may be arranged at a sideway of processing cup 9, for example A chemical liquid discharge path 27 is downwardly communicated, and a chemical liquid discharge valve 28 is interposed at a position therealong. An end of the chemical liquid injection pipe 41 is connected with the chemical liquid buffer tank 5. Another end of the chemical liquid injection pipe 41 is connected with, at between a chemical liquid valve 14 and a pump 6, a chemical liquid pipe 13. A chemical liquid injection valve 42 is interposed at a position along the chemical liquid injection pipe 41. Movements of buffer tank transfer mechanism 40 and open/close of chemical liquid injection valve 42 are controlled by a control unit 7.

Other parts of the configuration should be arranged in the same manner as described in the first embodiment.

Injection of chemical liquids into the chemical liquid buffer tank 5 proceeds as follows. A control unit 7 closes a chemical valve 14, a pressurized gas valve 32 and a chemical liquid discharge valve 28 and activates a pump 16, with a relief valve 36 and a chemical liquid injection valve 42 being opened. Thereby a chemical liquid pumped out from the pump 16 flows into the chemical buffer tank 5, via from a chemical liquid pipe 13 through a chemical liquid injection pipe 41. Gas in the chemical liquid buffer tank 5 is pushed out into a chemical liquid tank 12 via from a gas pipe 31 through a relief pipe 35. By activating the pump 16 for a period of time corresponding to the amount of chemical liquid to be reserved in the chemical liquid buffer tank 5, required amount of chemical liquid can be reserved in the chemical liquid buffer tank 5. After that, the control unit 7 closes the relief valve 36 and the chemical liquid injection valve 42, while maintaining the activation of the pump 16. Furthermore, the control unit 7 opens the pressurized gas valve 32, supplies pressurized gas into the chemical liquid buffer tank 5, and adds pressure inside the chemical liquid buffer tank 5.

Process flow proceeds in the same manner as heretofore described in the first embodiment (see FIG. 2). That is, chemical processing in this embodiment includes a whole-surface-liquid-film forming step (see step 2 in FIG. 2) and a small-flow-rate processing step (step 3).

In the whole-surface-liquid-film forming step (step S2), the whole chemical liquid reserved in the chemical liquid buffer tank 5 is supplied toward the principal face (upper face) of the substrate W in a single burst. To be more specific, a control unit 7 opens a chemical liquid discharge valve 28. Thereby, the entire amount of chemical liquid reserved in the chemical buffer tank 5 is pushed out by gravity and pressurized gas, to be discharged in a single burst in a large flow rate via a chemical liquid discharge path 27 toward the upper surface of the substrate. So, with this embodiment, a liquid film forming unit is configured such that a pressurized gas supply unit 6, a chemical liquid discharge path 27 and a chemical liquid discharge valve 28 discharge chemical liquids reserved in a chemical liquid buffer tank 5 in a single burst toward the principal face of a substrate W to cover the whole area of the principal face. In addition, the control unit 7 controls a buffer tank transfer mechanism 40 to transfer the chemical liquid buffer tank 5 up to a discharge position above the chemical liquid buffer tank 5, prior to opening of the chemical liquid discharge valve 28.

The discharge of the chemical liquid from the chemical liquid buffer tank 5 in a single burst at a large flow rate as well as the rapid rotation of the substrate W at a first rotational speed, causes an instantaneous spread of chemical liquid within the whole area of the substrate face, to form a liquid film covering the whole area of the principal face of the substrate W. To be more specific, dispensing of chemical liquid reserved in the chemical liquid buffer tank 5 for an amount of 30 to 70 cc is completed within about 2 seconds for example; thereby instantaneously covering the whole area of the principal face of the substrate W with a liquid film.

After this, the control unit 7 stops adding pressure by closing a pressurized gas valve 32, and then closes the chemical liquid discharge valve 28. Furthermore, the control unit 7 transfers the chemical liquid buffer tank 5, by controlling the buffer tank transfer mechanism 40, to a retreat position for retreating from above of the spin chuck 2. Then, the control unit 7 opens a chemical liquid valve 14 and chemical liquid is dispensed in a small-flow-rate, from a chemical liquid nozzle 11 toward the principal face of the substrate W. In this manner, small-flow-rate processing step (step S2) is performed. Before the above dispensing, the control unit 7 transfers the chemical liquid nozzle 11 to a processing position above the spin chuck 2 by controlling a nozzle transfer mechanism 17.

The processes thereafter are performed as described in the same manner as described in the first embodiment.

As in described hereinabove, according to this embodiment, a chemical liquid buffer tank 5 can be transferred, when required, to a discharge position that is above the principal face of a substrate W to discharge a chemical liquid therefrom. Releasing of the chemical liquid may be conducted in a single burst by taking advantages of gravitational forces. The chemical liquid buffer tank 5 can be retreated from a position above of the principal face of a substrate W, when the substrate W to be processed is transferred to a spin chuck 2 or when the processed substrate W is transferred from the spin chuck 2, so that it may not interfere with parts of the apparatus. The chemical liquid buffer tank 5 can also be retreated to a retreat position, either when a chemical liquid nozzle 11 is dispensing chemical liquid or when a rinse liquid nozzle 21 is dispensing rinse liquid, so as to avoid drippings of chemical liquids or the like therefrom onto the principal face of the substrate W.

The embodiment described above can have other effects and advantages in a similar manner as described in the first embodiment.

Figure 6:
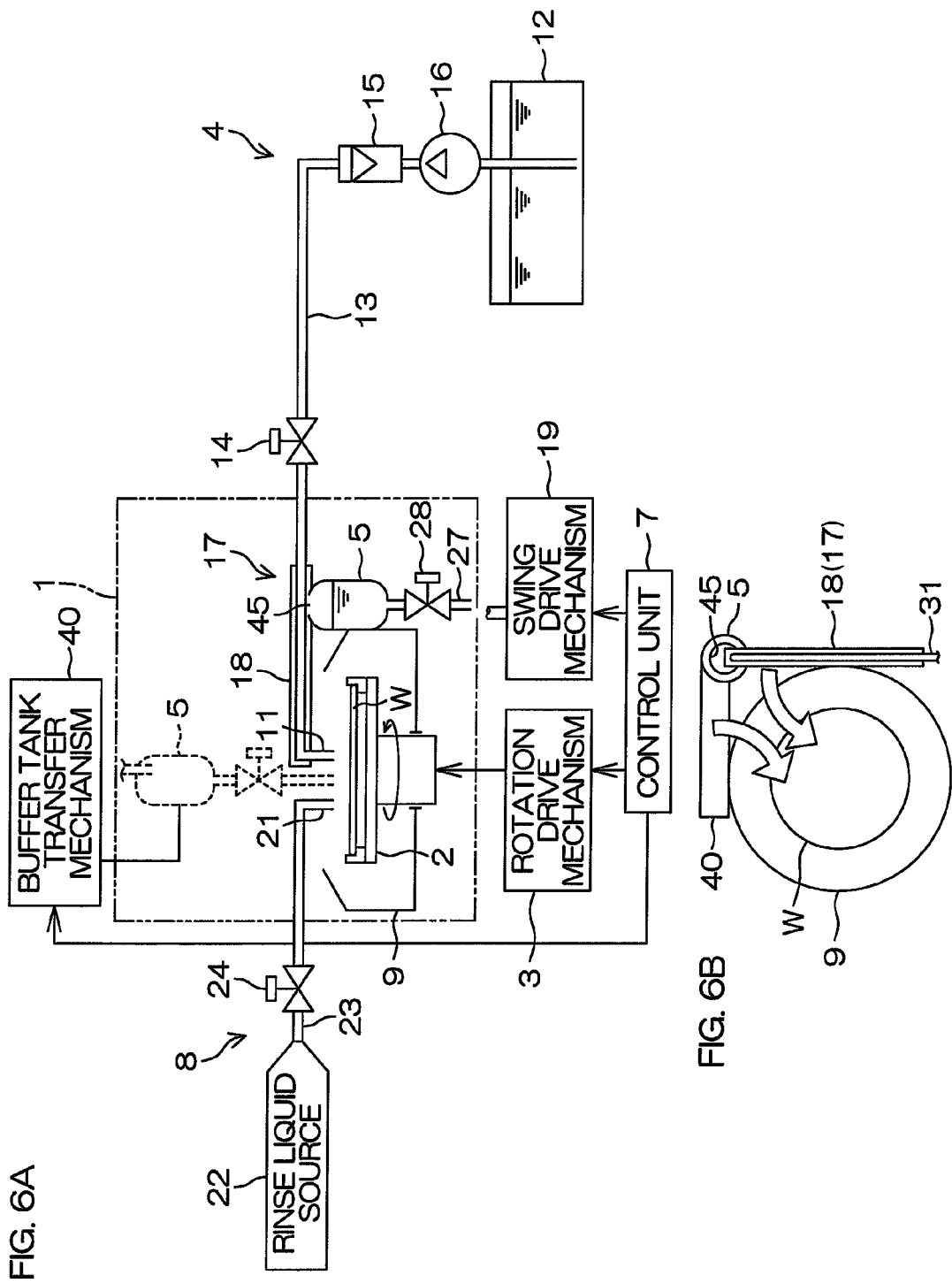
FIG. 6A and FIG. 6B illustrate a configuration of a substrate processing apparatus in accordance with a third embodiment of the present invention.

FIG. 6A and FIG. 6B illustrate a configuration of a substrate processing apparatus according to the third embodiment of the invention. In FIG. 6A and FIG. 6B, like parts shown in aforementioned FIG. 5 are given corresponding like reference numerals. FIG. 6B is a plan view of a configuration inside of the process chamber 1 shown in FIG. 6A.

Compared to the second embodiment, neither components concerning a pressurized gas supply nor components related to a chemical liquid injection pipe 41 are included in this embodiment.

A retreat position for a chemical liquid buffer tank 5 which is to be transferred by a buffer tank transfer mechanism 40, is positioned just below a nozzle retreat position for a chemical liquid nozzle 11. In FIG. 6A, a discharge position for the chemical liquid buffer tank 5 is represented by alternate long and two short dashes lines, and a retreat position is represented by solid lines. A control unit 7 opens a chemical liquid valve 14 when a chemical liquid buffer tank 5 is at a retreat position and a chemical liquid nozzle 11 is at a nozzle retreat position. Thereby, a chemical liquid brought into a chemical liquid pipe 13 by pump 16, is dispensed from a chemical liquid nozzle 11. Then the chemical liquid is injected, from a chemical liquid inlet 45 formed on the upper face of the chemical liquid buffer tank 5, into the inside of the chemical liquid buffer tank 5. In this way, it is possible to perform chemical liquid injection into the chemical liquid buffer tank 5.

In whole area of liquid film forming step (step 2 in FIG. 2), the whole chemical liquid reserved in a chemical liquid buffer tank 5 is supplied in a single burst onto the principal face (upper face) of a substrate W. To be more specific, a controller 7 opens a chemical liquid discharge valve 28. As a result of this, the entire amount of chemical liquid reserved in the chemical liquid tank 5 flows down in a single burst in a large flow rate by gravity, through a chemical liquid discharge path 27 toward the upper face of a substrate W. As described above, with this embodiment, a chemical liquid discharge path 27 and a chemical liquid discharge valve 28 constitute a liquid film forming unit for instantaneously forming a liquid film covering the whole area of the principal face of a substrate W. As may be apparent from the foregoing embodiments, the control unit 7 transfers the chemical liquid buffer tank 5 at a discharge position (a position indicated by alternate long and two short dashes lines in FIG. 6A) above a spin chuck 2 by controlling a buffer tank transfer mechanism 40, before opening of the chemical liquid discharge valve 28. Releasing of chemical liquid from the chemical liquid buffer tank 5 in a large flow rate while the substrate W being rapidly rotated at a first rotational speed, results in an instantaneous spread of the chemical liquid over the whole area which results in a formation of a liquid film covering the whole area of the principal face of the substrate W.

Processes thereafter are performed in a similar manner as in the second embodiment.

According to this embodiment, when a chemical liquid buffer tank 5 is positioned at a retreat position, chemical liquid can be injected into a chemical liquid buffer tank 5 by utilizing a chemical liquid nozzle 11. Thereby, it is possible to reduce costs with this embodiment owning to the fact that there is no need for dedicated components for chemical liquid injection.

Figure 7:
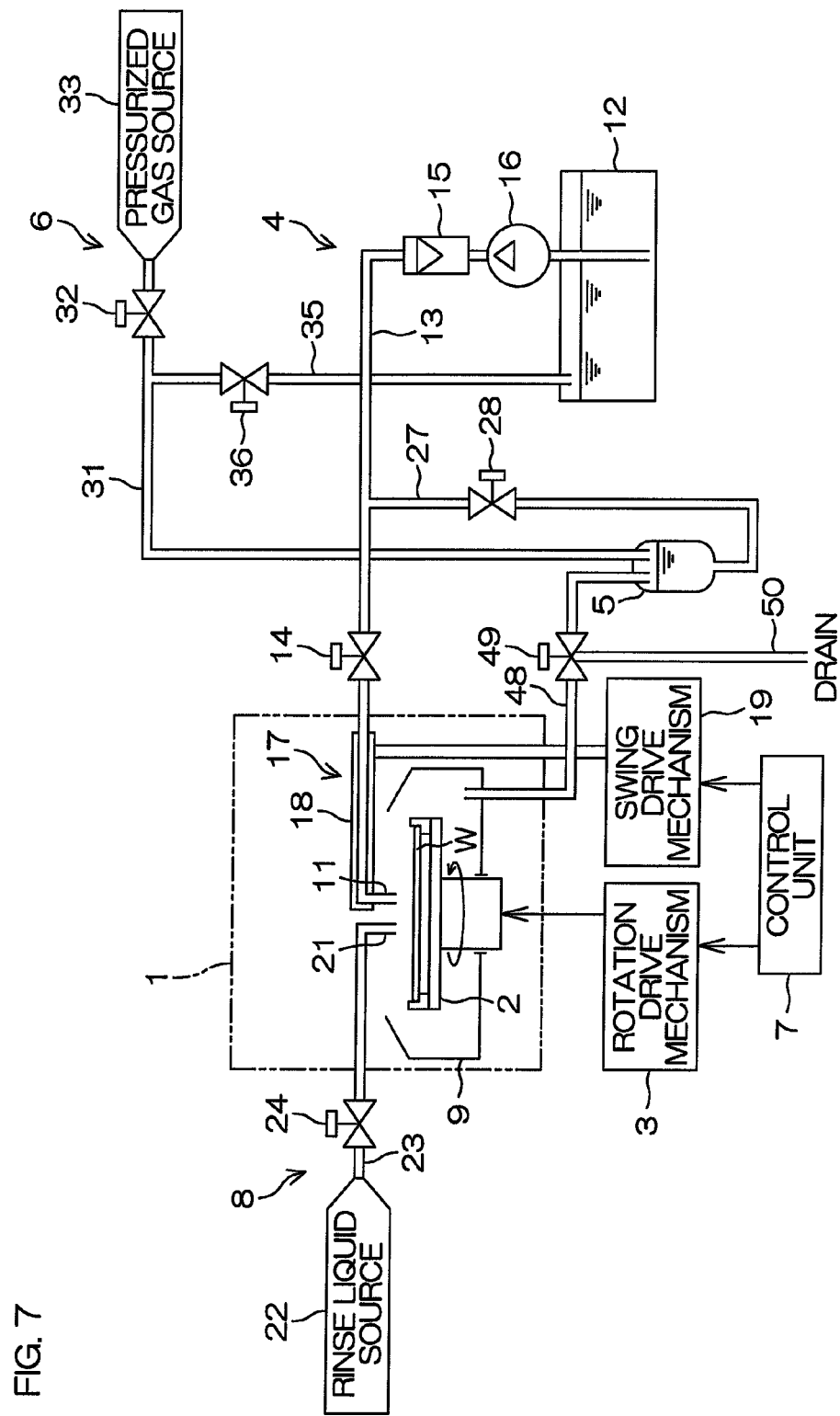
FIG. 7 illustrates a configuration of a substrate processing apparatus in accordance with a fourth embodiment of the present invention.

FIG. 7 illustrates a configuration of a substrate processing apparatus according to the fourth embodiment of the invention. In FIG. 7, like reference numerals represent corresponding like parts shown in the aforementioned FIG. 1.

With this embodiment, used chemical liquid supplied to a substrate W held by a spin chuck 2 is received by a process cup 9, is flowed through a chemical liquid recovering pipe 48 (an example for a processing liquid recovering unit), and is recovered to be guided into a chemical liquid buffer tank 5. At a position along the chemical liquid recovering pipe 48, a three-way valve 49 is interposed. The three-way valve 49 is connected with a drain pipe 50. The three-way valve 49 is controlled by a control unit 7.

When both upstream side (treatment cup 9 side) and downstream side (chemical liquid buffer tank 5 side) of the chemical liquid recovery pipe 48 are communicated by controlling the three-way valve 49, used chemical liquid flows through a chemical liquid recovering pipe 48 and then is injected into a chemical liquid buffer tank 5. Thereby it is possible to conduct injections of chemical liquid into the chemical liquid buffer tank 5. When both upstream side and a drain pipe 50 are communicated by controlling the three-way valve, used chemical liquid is guided from the chemical liquid recovery pipe into the drain pipe 50, only to be drained out. Thereby, it is possible to avoid injection of excessive chemical liquid into the chemical liquid buffer tank 5. In this state, it is also possible to inject a chemical liquid form a chemical liquid pipe 13 into the chemical liquid buffer tank 5.

According to this embodiment, it is possible to recover used chemical liquid and have it reserved in the chemical buffer tank 5 to reuse it to form a liquid film covering the whole area of the principal face of a substrate W, as described above. Thus it is possible to further decrease amount of consumption for chemical liquid, thereby further reducing running costs.

Figure 8:
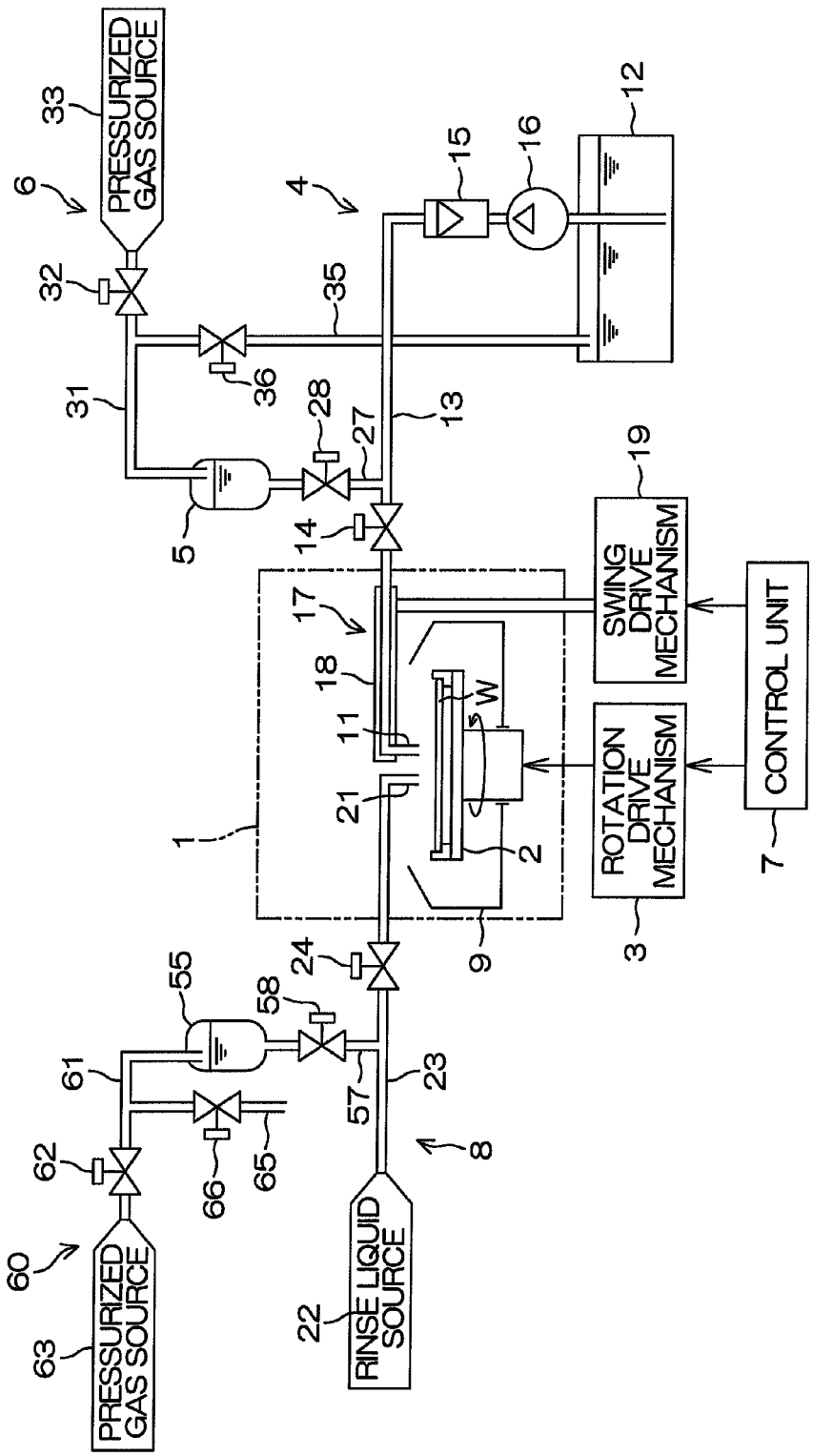
FIG. 8 illustrates a configuration of a substrate processing apparatus in accordance with a fifth embodiment of the present invention.

FIG. 8 illustrates a configuration of a substrate processing apparatus according to the fifth embodiment of the invention. In FIG. 8, like reference numerals represents corresponding like parts shown in the FIG. 1. With this embodiment, adding to the components shown in FIG. 1, a rinse liquid buffer tank 55 and a pressurized gas supply unit 60 for pushing out rinse liquid reserved in the rinse liquid buffer tank 55, are provided.

The rinse liquid buffer tank 55 is a reservoir for rinse liquid, capable of reserving rinse liquid sufficient to form a liquid film covering the whole area of the principal face (upper face) of a substrate W held by a spin chuck 2. The rinse liquid buffer tank 55 is a closed vessel; a rinse liquid discharge path 57 being connected with the lower face thereof and a gas pipe 61 being introduced from the upper face thereof. The rinse liquid discharge path 57 is connected with a rinse liquid pipe 23. To be more specific, the rinse liquid discharge path 5 is connected at a point between a rinse liquid source 22 and a rinse liquid valve 24, with the rinse liquid pipe 23. A rinse liquid discharge valve 58 is interposed at a position along the rinse liquid discharge path 57. Open/close of the rinse liquid discharge valve 58 is controlled by a control unit 7.

In order to push out rinse liquid reserved in the rinse liquid buffer tank 5, a pressurized gas supply unit 60 is provided. The pressurized gas supply unit 60 has a gas pipe 61 connected with a rinse liquid buffer tank 55, and pressurized gas valve 62 interposed at a position along the gas pipe 61. The gas pipe 61 is arranged so as to be supplied a pressurized gas from a pressurized gas source 63. It is preferable that the pressurized gas is an inert gas such as nitrogen gas and the like. Open/close of the pressurized gas valve 62 is controlled by the control unit 7.

One end of the relief pipe 65 is connected with the gas pipe 61 at a point between the rinse liquid buffer tank 55 and the pressurized gas valve 62. The other end of the relief pipe 35 is communicated with open atmosphere. The relief valve 66 is interposed at a position along the relief pipe 65. Open/close of the relief valve 66 is controlled by the control unit 7.

Injection of rinse liquid into the rinse liquid buffer tank 55 is performed as follows. That is, the control unit 7 closes both of the rinse liquid valve 24 the pressurized gas valve 62, and then opens both of a rinse liquid discharge valve 58 and a relief valve 66. Thereby, being pushed by pressure from the rinse liquid source 22, the rinse liquid flows, via from the rinse liquid pipe 23 to the rinse liquid discharge path 57, into the rinse liquid buffer tank 55. Gas in the rinse liquid buffer tank 55 is pushed out, via from the gas pipe 61 to the relief pipe 65, into the open atmosphere. Under this condition, by waiting for a lapse of time corresponding to the amount of the rinse liquid to be reserved in the rinse liquid buffer tank 55, requisite amount of rinse liquid can be reserved in the rinse liquid buffer tank 55. Thereafter, the control unit 7 closes the relief valve 66. Furthermore, the control unit 7 opens the pressurized gas valve 62 to supply pressurized gas into the rinse liquid buffer tank 55 and to add pressure therein. Processes as such are performed until a rinse step (step S4 in FIG. 2) starts (for example, at during chemical liquid processing).

After this, when the control unit 7 opens the rinse liquid valve 24 to start a rinse step, the entire amount of rinse liquid reserved in the rinse liquid buffer tank 55 is supplied in a single burst onto the principal face (upper face) of a substrate W. To be more specific, the entire amount of the rinse liquid, reserved in the rinse liquid buffer tank 55, is pushed out to the rinse liquid pipe 23 by pressurized gas, and is dispensed from the rinse liquid nozzle 21 in a single burst in a large flow rate toward the upper face of the substrate W. Because of the fact that rinse liquid is dispensed from the rinse liquid nozzle 21 at a large flow rate and the substrate W is rapidly rotated in rinse process speed, the rinse liquid instantaneously spreads over the whole area of the principal face of the substrate W to form a liquid film covering the whole area of the principal face of the substrate W. More specifically, for example, 30 to 70 cc of chemical liquid reserved in the chemical liquid buffer tank 5 would be dispensed completely within on the order of 2 seconds. Thereby the whole area of the principal face of the substrate W is instantaneously covered with a liquid film; thus enabling substantially simultaneous termination of the process with chemical liquid over the whole area of the principal face of the substrate W.

Thereafter the control unit 7 closes the pressurized gas valve 62 to stop adding pressure, and closes the rinse liquid discharge valve 58. After that, a rinse liquid from the rinse liquid source 22 is dispensed toward the principal face of the substrate W at a normal flow rate.

As described herewith, owning to the fact that it is possible to supply a large amount of rinse liquid in a single burst onto the principal face of the substrate W at the beginning of a rinsing step according to this embodiment, it is possible to simultaneously stop processing with chemical liquid throughout the whole area of the principal face of the substrate W; thereby further improving uniformity of substrate processing within the face of the substrate.

Figure 9:
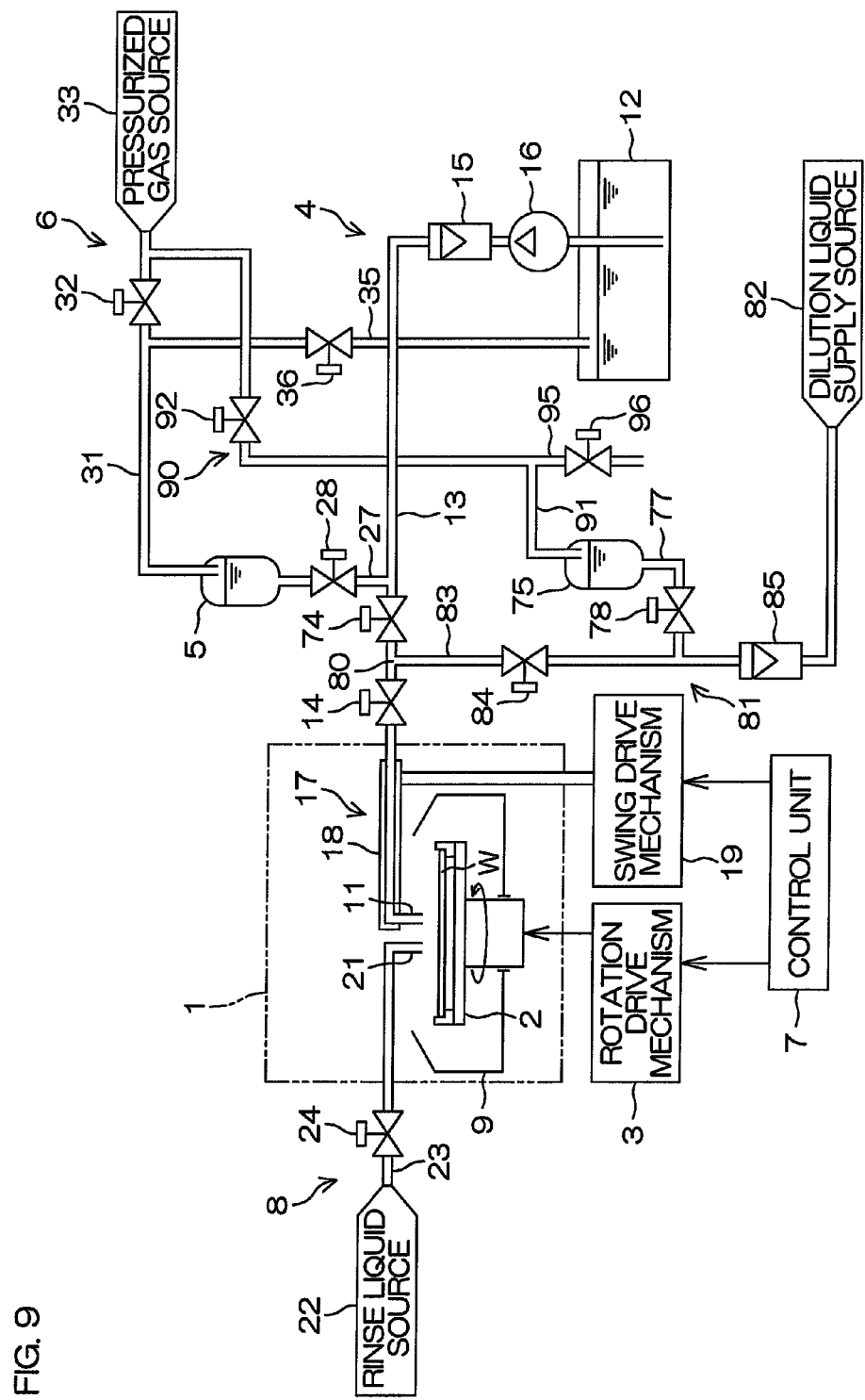
FIG. 9 illustrates a configuration of a substrate processing apparatus in accordance with a sixth embodiment of the present invention.

FIG. 9 illustrates a configuration of substrate processing apparatus according to the sixth embodiment of the invention. In FIG. 9, like reference numerals represents corresponding like parts shown in the aforementioned FIG. 1.

In the aforementioned first to fifth embodiments, examples are shown in which already mixed chemical liquid is reserved in a chemical liquid tank 12 only to be dispensed as it is from a chemical liquid nozzle 11. On the other hand, in the sixth embodiment, undiluted solution (chemical liquid before mixing) is reserved in a chemical liquid tank 12, in which the undiluted solution is diluted with a diluting liquid (deionized water (DIW) in this embodiment) while flowing through pipes, in order to prepare a chemical liquid mixed to an adequate density.

To be more specific, an undiluted chemical liquid solution valve 74 is interposed on a chemical liquid pipe 13 at a position between a chemical liquid valve 14 and a pump 16 (to be more accurate, at between a chemical liquid valve 14 and a flowmeter 15). The chemical liquid pipe 13 positioned at an upstream side of the undiluted chemical liquid solution valve 74, is a chemical liquid line through which undiluted chemical liquid solution communicates. A chemical liquid discharge path 27 of a chemical liquid buffer tank 5 is connected with the undiluted chemical liquid solution line.

The chemical liquid pipe 13, which is positioned at a point between the chemical liquid valve 14 and the undiluted chemical liquid solution valve 74, is arranged such that the undiluted liquid from a dilution liquid supply unit 81 is supplied thereinto. That is, one end of the dilution liquid pipe 83 is connected with the chemical liquid pipe 13 which is positioned between the chemical liquid valve 14 and the undiluted chemical liquid solution valve 74. Another end of the diluting liquid pipe 83 is connected with a diluting liquid source 82. A diluting liquid valve 84 and a flowmeter 85 are interposed at a position along the diluting liquid pipe 83. Thus, it is possible to mix chemical liquid and diluting liquid at a mixing point 80 of the chemical liquid pipe 13 and the diluting liquid pipe 83, at a mix ratio corresponding to a flow rate ratio therebetween, by opening the diluting liquid valve 84, thereby preparing chemical liquid which is diluted to a predetermined density. Accordingly, chemical liquid is prepared by diluting an undiluted chemical liquid solution to a predetermined density. Output signals of the flowmeter 85 are arranged to be input to the control unit 7. Open/close of the diluting liquid valve 84 is arranged to be controlled by control unit 7.

A substrate processing apparatus according to this embodiment is provided with a dilution liquid buffer tank 75 (an example of a reservoir for process liquid) and a pressurized gas supply unit 90 for pushing out dilution liquid reserved in the dilution liquid buffer tank 75. With this embodiment, in whole face liquid film forming step (step S2 in FIG. 2), both an undiluted chemical liquid solution in a chemical liquid buffer tank 5 and a dilution liquid in a dilution liquid buffer tank 75 are discharged in a single burst as they are mixed together to prepare a chemical liquid; thereby the prepared chemical liquid is supplied in a single burst onto the principal face of a substrate to form a liquid film which covers the whole area of the principal face of the substrate held by a spin chuck 2. Accordingly, the chemical buffer tank 5 and the dilution liquid bugger tank 75 serve as reservoirs for processing liquids, having a volume capacity to be able to reserve predetermined amount of undiluted chemical liquid and dilution liquid, respectively, in such a way that the amount of chemical liquid prepared by mixing them together is sufficient to form a liquid film covering the whole area of the principal face (upper face) of a substrate W held by the spin chuck 2.

The dilution liquid buffer tank 75 is a closed vessel, a diluting liquid discharge path 77 is connected with the lower face thereof, and a gas pipe 91 is introduced from the upper face thereof. The dilution liquid discharge path 77 is connected with a dilution liquid pipe 83. To be more specific, the dilution liquid discharge path 77 is connected with a dilution liquid pipe 83, at a position between the dilution liquid valve 84 and the dilution liquid source 83 (more precisely, at between the dilution liquid valve 84 and the flowmeter 85). A dilution liquid discharge valve 78 is interposed at a position along the dilution liquid discharge path. Open/close of the dilution liquid discharge valve 78 is controlled by the control unit 7.

A pressurized gas supply unit 90 is so configured as to push out dilution liquid reserved in the dilution liquid buffer tank 75 by pressurized gas. That is, the pressurized gas supply unit 90 is provided with a gas pipe 91 connected with the dilution liquid buffer tank 75, and a pressurized gas valve 92 interposed at a position along the gas pipe 91. The gas pipe 91 joins a gas pipe 31 at a upstream side of a pressurized gas valve 32, and is so arranged as to be supplied with pressurized gas from a pressurized gas source 33. Open/close of a pressurized gas valve 92 is controlled by the control unit 7.

One end of a relief pipe 95 is connected with the gas pipe 91, at a point between the dilution liquid buffer tank 75 and the pressurized gas valve 92. Another end of the relief pipe 95 is open to the atmosphere. Interposed at a position along the relief pipe 95, is a relief valve 96; the control unit 7 controls open/close thereof.

Injection of dilution liquid into the dilution liquid buffer tank 75 is performed in a manner as follows. That is, the control unit 7 closes the dilution liquid valve 84 and the pressurized gas valve 92, and opens the dilution valve 78 and the relief valve 96; thereby, pushed by initial pressure in the dilution liquid supply source 82, dilution liquid flows into the dilution liquid buffer tank 75, via from dilution liquid pipe 83 to dilution liquid discharge path 77. The gas in the dilution liquid buffer tank 75 is pushed out, via from the gas pipe 91 to the relief pipe 95, into the atmosphere. Under the state described abode, by waiting for a period of time corresponding to the amount of dilution liquid to be reserved in the dilution liquid buffer tank 75, a requisite amount of dilution liquid can be reserved therein. After that, the control unit 7 closes the relief valve 96. Furthermore, the control unit 7 opens the pressurized gas valve 92, to allow the dilution liquid buffer tank 75 to be supplied with pressurized gas, adding pressure within the dilution liquid buffer tank 75. Such Operations are performed before the chemical liquid processing starts. Similar operations are executed for the chemical liquid buffer tank 5, to inject undiluted liquid therein, and to add pressure therein. Other details of operations are similar to that described in the first embodiment.

The chemical liquid processing includes the whole face liquid film forming step (step S2 in FIG. 2), and a small-flow-rate processing step (step S3 in FIG. 2) as in the case of the first embodiment.

In the whole-surface-liquid-film forming step (step S2), the entirety of the undiluted chemical liquid solution reserved in the chemical liquid buffer tank 5 and the entire dilution liquid reserved in the dilution liquid buffer tank 75 are, as a chemical liquid that is mixed and prepared at a mixing point 80, supplied in a single burst onto the principal face (upper face) of the substrate W. Specifically, the control unit 7 opens the chemical liquid valve 14, the undiluted chemical liquid solution valve 74 and dilution liquid valve 84. Thereby, the entire amount of the undiluted solution reserved in the chemical liquid buffer tank 5 is pushed out by pressurized gas to the chemical liquid pipe 13; and also the entire amount of the dilution liquid reserved in the dilution liquid buffer tank 75 is pushed out by pressurized gas to the dilution liquid pipe 83. Thereby, the undiluted chemical liquid solution and the dilution liquid are mixed together at the mixing point 80 along the chemical liquid pipe 13 to prepare a prepared chemical liquid which is then dispensed from a chemical liquid nozzle 11 toward the upper face of the substrate W, in a single burst and in a large flow rate. In addition, until before the above dispensing takes place, the control 7 transfers the chemical liquid nozzle 11 to a process position above the spin chuck 2 by controlling a nozzle transfer mechanism 17. Because chemical liquid is dispensed from the chemical liquid nozzle 11 at a large flow rate and the substrate W is rapidly rotated at a first rotational speed, the chemical liquid instantaneously spreads over the whole area of the principal face of the substrate W to form a liquid film covering the whole area of the principal face of the substrate W.

Thereafter, the control unit 7 closes the pressurized gas valve 32 and 92 in to stop adding pressure, and closes both a chemical liquid discharge valve 28 and a dilution liquid discharge valve 78. Thereby an undiluted chemical liquid solution pumped out from a chemical liquid tank 12 by a pump 16 and a dilution liquid from a dilution source 82 are supplied to the mixing point 80, to be mixed at a mix ratio corresponding to a flow rate ratio thereof, thereby preparing a chemical liquid. More specifically, flow rate of the undiluted chemical liquid solution may be on the order of 4 cc/minutes, and flow rate of the dilution liquid may be on the order of 200 cc/minutes. The flow rate (consequently, the mixing ratio) in this case is represented by:

(undiluted chemical liquid solution:dilution liquid)=1:50

The chemical liquid thus prepared is supplied from the chemical liquid pipe 13 to the chemical liquid nozzle 11, and dispensed at a small-flow-rate from the chemical liquid nozzle 11 to the principal face of the substrate W. The small-flow-rate processing step is performed in this manner. In performing the step, the control unit 7 decelerates rotational speed of the spin chuck 2 or that of the substrate W, to a second rotational speed by controlling a rotation drive mechanism 3. Accordingly, in the small-flow-rate processing step, chemical liquid is supplied onto liquid film on the surface of the substrate W, at a small-flow-rate in a state wherein the substrate W is slowly rotated.

Thereafter, the control unit 7 closes the chemical liquid valve 14, undiluted chemical liquid solution valve 74 and dilution liquid valve 84, stops the pump 16 to stop the chemical processing, and performs rinsing step. Operations hereafter are performed in the similar manner as in the first embodiment.

As described above, according to this embodiment, it is possible to perform the whole area of liquid film forming process at the beginning of chemical processing in a configuration wherein undiluted chemical liquid solution and dilution liquid are mixed along pipes to prepare chemical liquid. Furthermore, the chemical liquid buffer tank 5 and the dilution liquid buffer tank 5 are provided, respectively corresponding to the undiluted chemical liquid solution and the dilution liquid, so as to allow an undiluted chemical liquid solution and a dilution liquid to flow simultaneously into the chemical liquid pipe 13 to be mixed together; because of this, in the entire area liquid forming step as well, the undiluted chemical liquid solution and a diluting liquid can be mixed at a predefined mix ratio without experiencing fluctuations thereof.

As an alternative to the configuration above, it might be conceivable to have a configuration wherein a first flow rate control valve is arranged at a position along a undiluted chemical liquid solution line, and a second flow rate control valve is arranged at a position along a dilution liquid pipe so as to respectively supply a undiluted chemical liquid solution and a dilution liquid, for example. But, configurations as such present not only a problem as to costs owning to employment of expensive flow control valves, but also a problem in that mix ratio between undiluted chemical liquid solution and dilution liquid becomes unstable when flow rate changes. In other words, it is difficult to maintain density of chemical liquid at predetermined level when flow rates of chemical liquid change.

No such problems as such does occur in a configuration according to this embodiment. Further it is possible to supply a chemical liquid mixed at a certain density onto the principal face of a substrate W in the entire area liquid film forming step and the small-flow-rate processing step, in spite of the fact that the configuration does not employ expensive flow control valves; thereby realizing a high-quality substrate processing.

Although the preferred embodiments of the present invention have been described hereinabove, it should be clear for those skilled in the art that the present invention may be put into practice in other modes as well. For example, the process liquid recovery unit indicated in the configuration shown in FIG. 7 may be employed to the configuration shown in FIG. 6B so that used chemical liquid is injected into the chemical liquid buffer tank 5 at a retreat position. Also, the rinse liquid buffer tank 55 shown in the FIG. 8 and components related thereto can be provided in other embodiments. Further, although a configuration wherein the undiluted chemical liquid solution is diluted by the dilution liquid was shown in the FIG. 9, the same configuration can be employed more generally in such cases that two types of process liquids are mixed in pipe to prepare a prepared process liquid. It should be clear that, mixing of three types of process liquids in pipe can be conducted in a similar manner. Moreover, while etching liquid is exemplified as a type of chemical liquid in the aforementioned embodiments, other substrate processing adopting other types of chemical liquid such as polymer removal liquid, resist stripping liquid, silylation liquid, or developing solution or the like are applicable to the present invention as well. Moreover, application of various change in design are possible within the scope of the invention described in the attached claims.

Although the preferred embodiment of the present invention has been described in detail, the embodiment is merely a specific example used to clarify the technical contents of the present invention, and the present invention should not be understood as being limited to this specific example; and the scope of the present invention is limited solely by the appended claims.

The present application corresponds to Japanese Patent Application No. 2011-213272 filed in the Japan Patent Office on Sep. 28, 2011, the entire disclosure of which is incorporated herein by reference.

What is claimed is:

1. A substrate processing method comprising the steps of:
   rotating a substrate;
   reserving a process liquid in a process liquid reservoir in a predetermined amount sufficient to form a liquid film covering the whole area of a principal face of the substrate;
   forming the liquid film covering the whole area of the principal face of the substrate by supplying process liquid reserved by the process liquid reservoir toward the principal face of the substrate being rotated;
   wherein the liquid film forming step includes the steps of supplying pressurized gas to pressurize said process liquid reservoir and then using said pressurized gas to push out the process liquid reserved in the process liquid reservoir, and thereby supply said process liquid to said substrate in a single burst; and
   after the liquid film forming step, dispensing the process liquid from a process liquid nozzle toward the principal face of the substrate being rotated.

2. The substrate processing method according to claim 1, wherein the substrate rotating step includes the steps of:
   first, rotating the substrate at a first rotational speed in parallel with the liquid film forming process; and
   second, rotating the substrate at a second rotational speed that is slower than the first rotational speed in parallel with the dispensing step.

3. The substrate processing method according to claim 1, wherein the process liquid reservoir includes a first process liquid reservoir for reserving a first process liquid and a second process liquid reservoir for reserving a second process liquid, and the liquid film forming process includes the steps of: releasing the first process liquid from the first process liquid reservoir in a single burst, releasing the second process liquid from the second process liquid reservoir in a single burst, and supplying the first and second process liquid onto the principal face of the substrate while being mixed together.

4. The substrate processing method according to claim 1, wherein the liquid film forming process includes the step of releasing the process liquid reserved in the process liquid reservoir at a process liquid releasing position that is positioned above the principal face of the substrate being rotated.

5. The substrate processing method according to claim 4, wherein the reserving step includes the step of supplying the process liquid dispensed from the process liquid nozzle into the process liquid reservoir by disposing the process liquid reservoir at a retreat position that is retreated from a position above the principal face of the substrate.

6. The substrate processing method according to claim 1, further comprising the step of recovering a used process liquid that has been supplied from the process liquid nozzle toward the substrate and used for processing, and guiding the used process liquid into the process liquid reservoir.

7. The substrate processing method according to claim 1, wherein the whole quantity of the process liquid reserved in the process liquid reservoir is pushed out toward the substrate in said single burst.

8. The substrate processing method according to claim 1, wherein said process liquid reservoir is hermetically closed.

9. The substrate processing method according to claim 8, wherein a valve is disposed in a pipe that carries said process liquid from said process liquid reservoir to said substrate; and
   after said pressurized gas has been supplied to said reservoir, said valve is opened to thereby supply said process liquid to said substrate in the single burst.

10. The substrate processing method according to claim 1, wherein a valve is disposed in a pipe that carries said process liquid from said process liquid reservoir to said substrate; and after said pressurized gas has been supplied to said reservoir, said valve is opened to thereby supply said process liquid to said substrate in the single burst.

11. The substrate processing method according to claim 1, wherein said single burst supplies 30-70 cc of process liquid to said substrate within about 2 seconds.

* * * * *